(12) United States Patent
Olszak et al.

(10) Patent No.: US 7,061,584 B2
(45) Date of Patent: Jun. 13, 2006

(54) MULTI-AXIS PROJECTION IMAGING SYSTEM

(75) Inventors: Arthur G. Olszak, Tucson, AZ (US); Michael R. Descour, Tucson, AZ (US)

(73) Assignee: DMetrix, Inc., Tucson, AZ (US)

( * ) Notice: Subject to any disclaimer, the term of this patent is extended or adjusted under 35 U.S.C. 154(b) by 0 days.

(21) Appl. No.: 10/666,330

(22) Filed: Sep. 19, 2003

(65) Prior Publication Data

Related U.S. Application Data

(63) Continuation-in-part of application No. 10/637,486, filed on Aug. 11, 2003, which is a continuation of application No. PCT/US02/08286, filed on Mar. 19, 2002.

(60) Provisional application No. 60/412,331, filed on Sep. 19, 2002, provisional application No. 60/276,498, filed on Mar. 19, 2001.

(51) Int. Cl.
*G03B 27/42* (2006.01)
*G03B 27/54* (2006.01)

(52) U.S. Cl. .......................................... 355/67; 355/53
(58) Field of Classification Search .................. 355/46, 355/53, 67, 69, 70, 71
See application file for complete search history.

(56) References Cited

U.S. PATENT DOCUMENTS

| 5,260,826 A | 11/1993 | Wu |
| 5,625,436 A * | 4/1997 | Yanagihara et al. ........ 355/53 |
| 6,016,185 A | 1/2000 | Cullman et al. |
| 6,133,986 A | 10/2000 | Johnson |
| 6,238,852 B1 * | 5/2001 | Klosner ..................... 430/396 |
| 6,320,174 B1 | 11/2001 | Tafas et al. |
| 6,373,978 B1 | 4/2002 | Ishihara |
| 6,424,404 B1 | 7/2002 | Johnson |
| 6,509,955 B1 * | 1/2003 | Mei et al. ..................... 355/53 |
| 6,512,573 B1 | 1/2003 | Furter |
| 2002/0097495 A1 * | 7/2002 | Mei .......................... 359/618 |

FOREIGN PATENT DOCUMENTS

| GB | 2351556 A | 4/2000 |
| WO | WO 97/34171 | 9/1997 |

OTHER PUBLICATIONS

Hans J. Tiziani and Hans-Martin Uhde, "Three-dimensional analysis by a microlens-array confocal arrangement," Applied Optics, Feb. 1, 1994, vol. 33, No. 4, pp. 567-572.
R. Volkel, H.P. Herzig, et al., "Microlens Lithography and Smart Masks," Microelectric Engineering 35 (1997), pp. 513-516.
R. Volkel, H.P Herzig, et al., "Microlens array imaging system for photolithography," Opt. Eng. 35(11), pp. 3323-3330 (Nov. 1996).

* cited by examiner

*Primary Examiner*—Rodney Fuller
(74) *Attorney, Agent, or Firm*—Birdwell & Janke, LLP

(57) ABSTRACT

A multi-axis projection imaging system. Such a system includes a plurality of objectives defining respective object fields of view and corresponding image fields of view. An object is adapted for controllably illuminating the object fields of view with light that varies spatially in one or more selected characteristics, for creating respective images within the image fields of view.

33 Claims, 16 Drawing Sheets

MULTI-AXIS PROJECTION IMAGING SYSTEM

CROSS REFERENCE TO RELATED APPLICATION

This application claims the benefit of the applicants' provisional application Ser. No. 60/412, 331, incorporated by reference herein in its entirety, and is a continuation-in-part application of U.S. Ser. No. 10/637,486, filed Aug. 11, 2003, which is a continuation application of PCT/US/02/08286, filed Mar. 19, 2002, which claims the benefit of provisional application Ser. No. 60/276,498, filed Mar. 9, 2001.

FIELD OF THE INVENTION

This invention relates to a multi-axis projection imaging system.

BACKGROUND

A multi-axis imaging system employing an array of optical imaging elements is a recent development. Adapted for microscopy, the array is miniaturized to form a miniature microscope array of objectives ("microscope array"), each objective having its own optical axis and typically including a number of the optical imaging elements.

Image data are recorded using light-sensing elements such as CCD arrays associated with each objective. The optical elements are spaced a predetermined distance from one another, and the entire array and object are moved relative to one another so that the positional relationship between image data from the detectors is fixed and data are thereby automatically aligned, eliminating the need for what is known in the art as "tiling."

Another advantage of the multi-axis imaging system is its speed. An entire specimen can be imaged in one pass because the field of view (FOV) of the system can be arbitrarily large without sacrificing resolution.

Integrated circuit manufacturing processes include photolithographically defining circuit or other features on semiconductor wafers. These features include areas over which the wafer is doped and areas over which oxide and metal layers are deposited, to define and interconnect circuit structures. All of these areas are defined by photographic masks that are used in a projection imaging system to project light through the mask onto a wafer to which has been applied a photosensitive coating known in the art as photoresist. The mask includes open or light transmissive portions through which light passes into the photoresist and exposes the photoresist. The mask also includes closed or light opaque portions through which light is blocked from exposing the photoresist.

In a developing step of the process, photoresist that has been exposed to the light is removed while photoresist that has not been exposed to the light is not removed, or the reverse, depending on the whether the photoresist is positive or negative. Where photoresist remains after developing, it acts as a mask in subsequent processing; for example, for ionic implantation of dopants into the wafer, the ions are stopped from being implanted in the wafer where there is photoresist on the wafer. However, the ions are not stopped from being implanted where there is no photoresist on the wafer.

A mask defining a feature pattern for one die on a wafer may be stepped in rows and columns across the wafer to expose the wafer for all of the large number of die that can be formed from the wafer. However, this process is time-intensive and mechanically complex. Alternatively, a very large objective can be used with a large mask that defines the pattern for all the die on the wafer. However, it is desirable to increase the size of the wafers as much as possible to maximize economy of scale, and wafer size has steadily increased over time. For large diameter wafers, a correspondingly large objective is required to maintain high resolution, and the lenses used in such objectives are very expensive. The same problem arises whenever a large, high resolution image is to be projected.

Accordingly, there is a need for a multi-axis projection imaging system, for use in integrated circuit manufacture and for other uses as well.

SUMMARY

Preferred embodiments of a multi-axis projection imaging system are disclosed herein according to the present invention. An imaging system according to the invention includes a plurality of objectives defining respective object fields of view and corresponding image fields of view. An object is adapted for controllably illuminating the object fields of view with light that varies spatially in one or more selected characteristics, for creating respective images within the image fields of view. Preferably, the object produces a predetermined radiance pattern to be imaged onto an image surface within the image fields of view.

Objects, features and advantages of the invention will be more fully understood upon consideration of the following detailed description, taken in conjunction with the following drawings.

DETAILED DESCRIPTION

Figure 1:
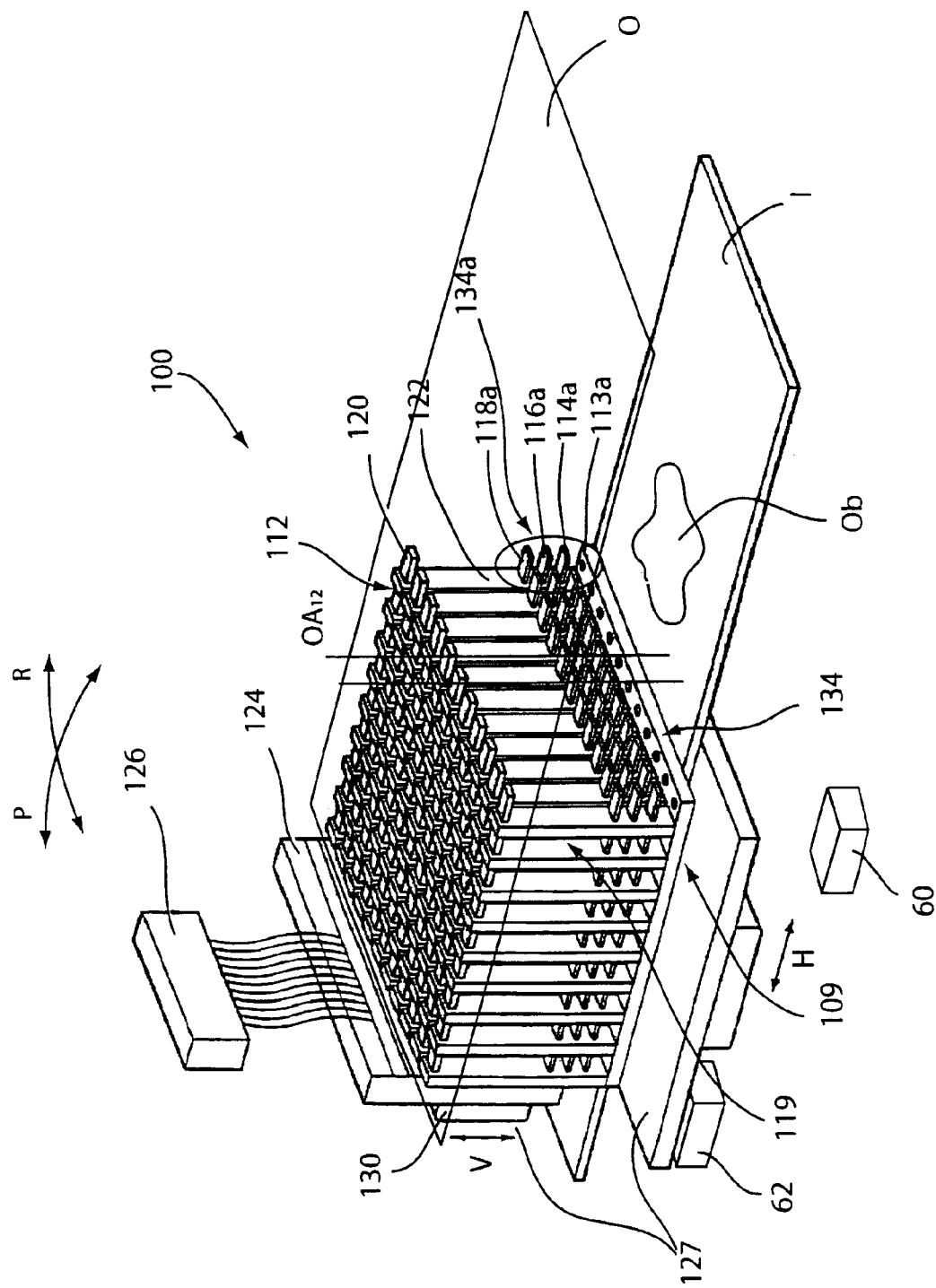
FIG. 1 is a pictorial view of an exemplary projection imaging system according to the present invention.

An exemplary multi-axis projection imaging system 100 according to the present invention is shown in FIG. 1. The system 100 includes an array of groups of optical elements 134, such as the optical elements 113a, 114a, 116a and 118a of the group 134a indicated in FIG. 1. Each group of optical elements is a miniature objective. The array defines two planes, an object plane O and an image plane I. An area of a physical object "Ob" on which it is desired to project an image is positioned with respect to the lens system 109 so that the area lays in the image plane I.

The objectives 134a are aligned so as to define respective optical imaging axes $OA_{12}$. The optical imaging axes of the array 100 are not collinear and therefore define a multi-axis system. The optical imaging axes are parallel for the usual circumstance of imaging onto a planar physical object, such as a semiconductor wafer, but may be provided to be not parallel for imaging onto a curved physical object, such as a pill bottle.

Figure 2:
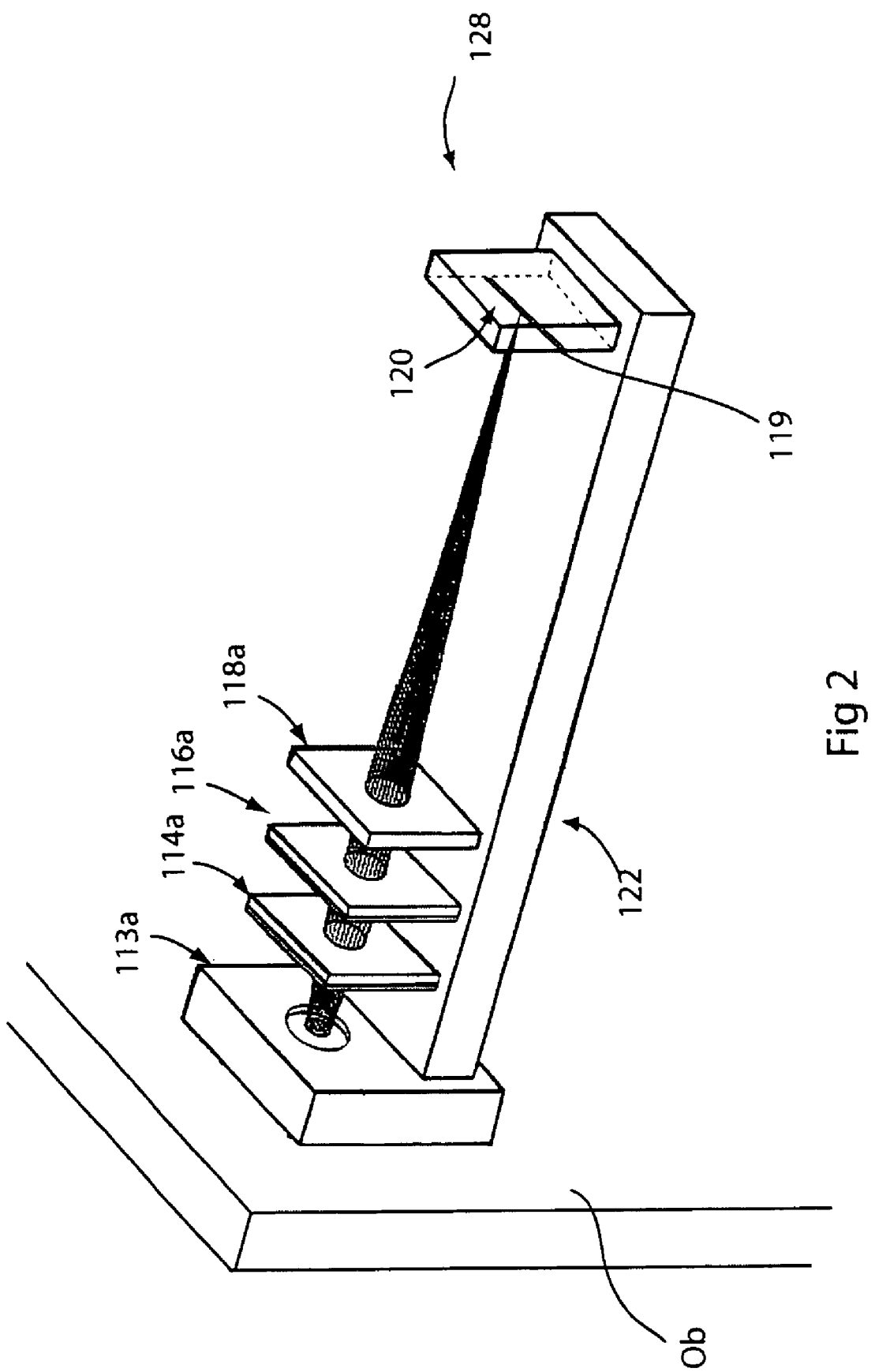
FIG. 2 is a pictorial view of a group of optical elements, or an objective, of the projection imaging system of FIG. 1, shown in greater detail.
Figure 3:
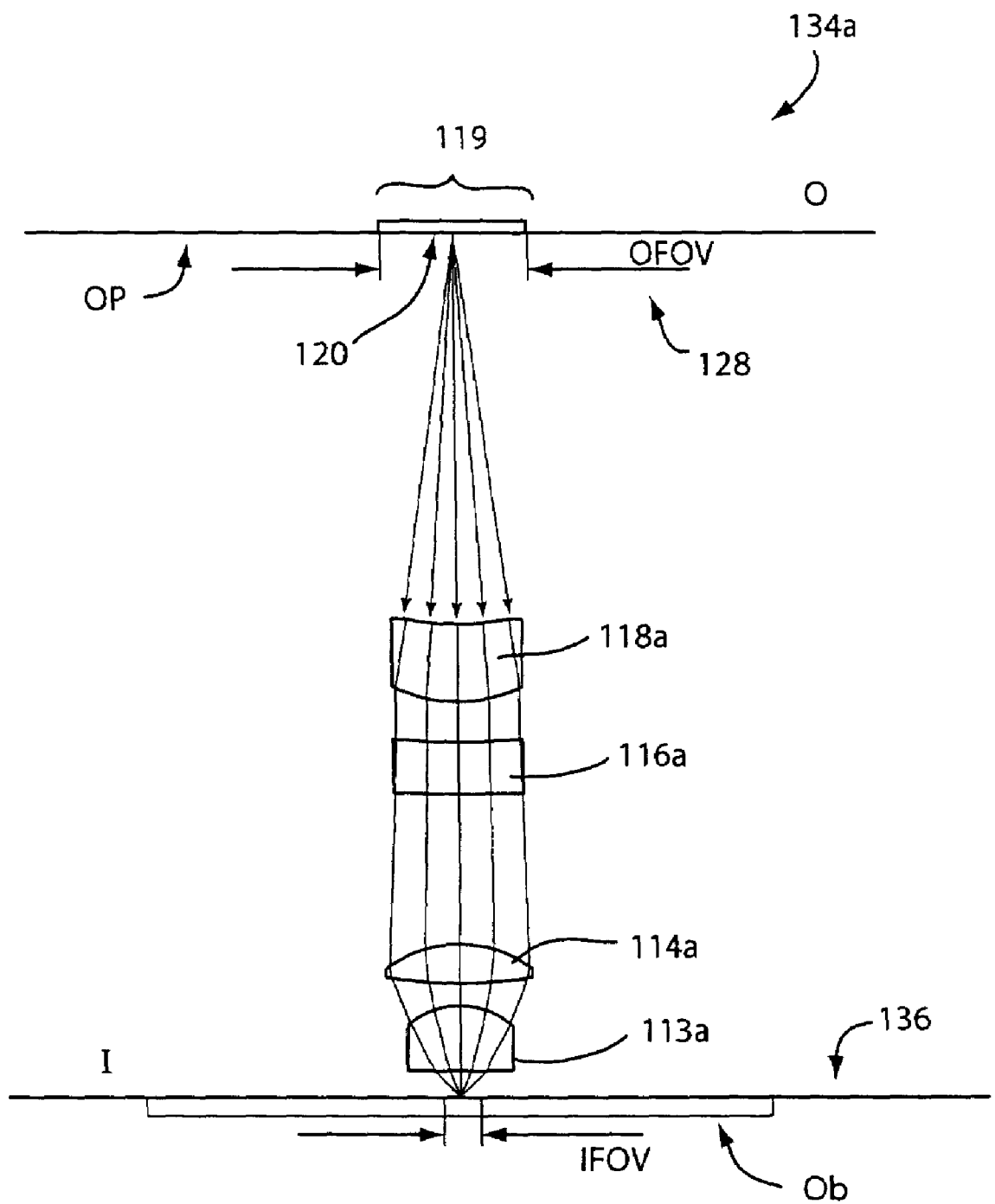
FIG. 3 is a schematic, ray-trace diagram of the objective of FIG. 2.

FIG. 2 shows one of the objectives 134a in greater detail, and FIG. 3 shows a schematic ray-trace diagram for the same group 134a. In this example, the optical elements 113a, 114a, 116a and 118a are all lenses, but other optical elements, such as polarizers, and stops may be provided, and more or fewer optical elements may be employed.

For projection imaging, an object 128 is optically disposed, i.e., either physically or virtually located, at the object plane O. The object 128 includes a plurality of groups 119 of individually addressable light producing elements 120 (hereinafter "pixels") corresponding to the objectives 134a. The pixels 120 are positioned with respect to the lens system 109, such as by being mounted on supports 122, so that active areas of the pixels lay in the object planes of the objectives. As will be described more fully below, the object 128 may comprise light emitting elements or passive elements with variable transmission or other optical characteristics, the elements being illuminated by an external light source.

According to the invention, the object 128 produces light having radiance or other characteristics that are controllably spatially variable. The object is imaged by the objective 134a onto the image plane I, and the spatially variable light pattern at the object plane is converted into an irradiance pattern at the image plane. More particularly, each group 119 of pixels 120 corresponds to an "object field of view" (OFOV) on the object plane O that is mapped by the objective 134a onto an "image field of view" (IFOV) on the image plane I. A physical object Ob, hereinafter referred to as a "device" to avoid confusion with the object 128, may be optically disposed at the image plane for receiving the image produced by the objective 134a.

With particular reference to FIG. 1, the system 100 may be used to scanningly produce an image on the device Ob. A height and tip/tilt-adjustment mechanism 130 is provided to translate the device in the vertical direction "V," and to adjust the pitch "P" and roll "R" of the device, for focusing the system 100, and accommodating any tip or tilt of the device. A scanning mechanism 127 is provided to translate the device laterally, e.g., in the horizontal direction "H," for scan translation. The scanning mechanism is typically a motorized stage or carriage adapted to hold the device; however, it will be readily appreciated that the scanning mechanism may move the system 100 rather than the device to provide relative motion between the device and the system.

A preferred use of the present invention is in standard photolithographic manufacturing of an integrated circuit, where a semiconductor wafer device Ob includes a layer 136 of photoresist. Light produced by the object 128 is imaged onto the photoresist to expose the photoresist according to a defined pattern of circuit features known as a "mask" in the art of integrated circuit manufacture. However, it should be understood that the light may be imaged onto any device for any purpose without departing from the principles of the invention. While an image of the object may be recorded or captured using any photosensitive materials, including chemically and electronically photosensitive materials, it should also be understood that it may not be essential to record or capture the projected image in any particular application.

Figure 4:
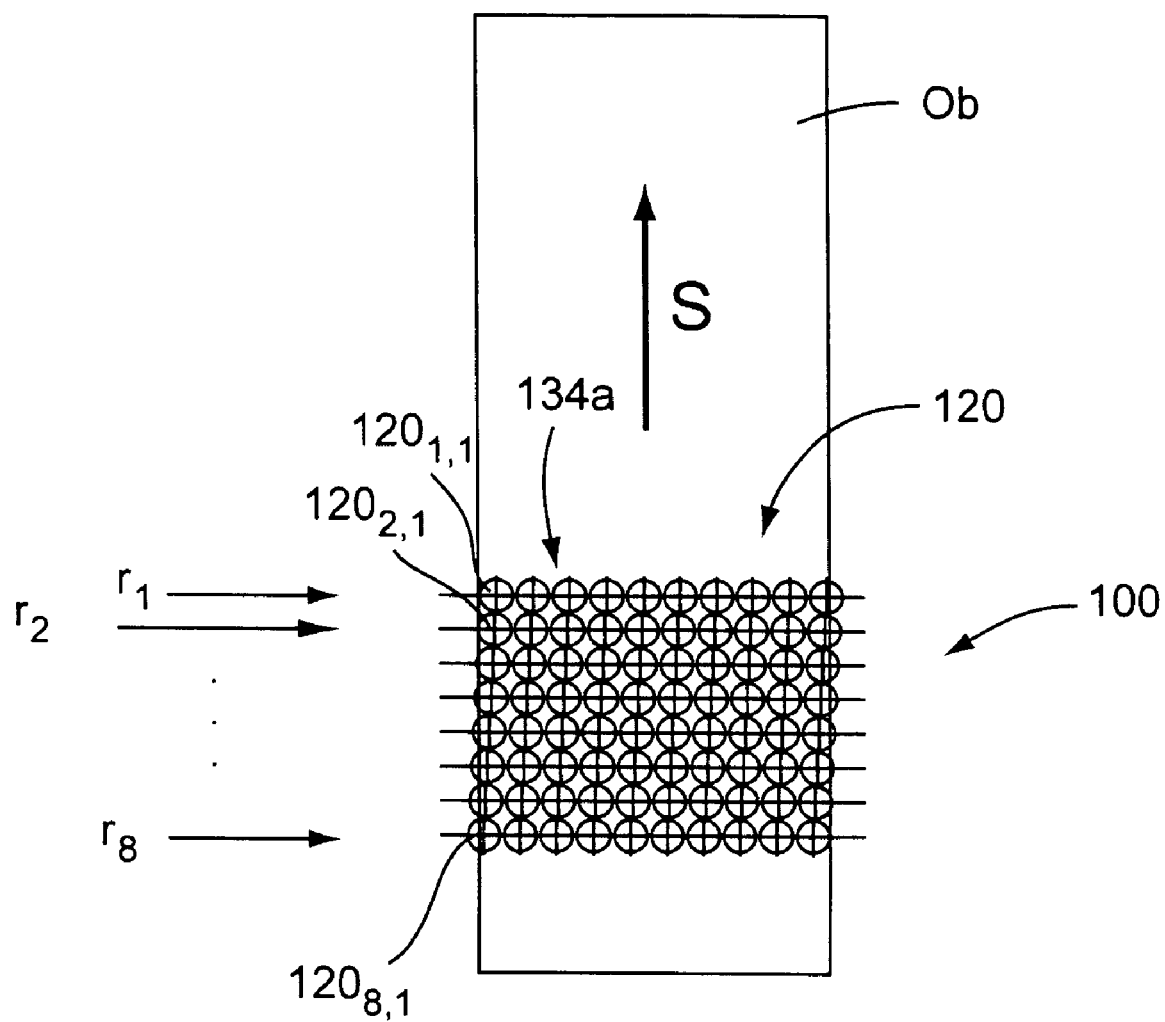
FIG. 4 is a plan view of the array of FIG. 1, showing objectives and light producing elements according to the present invention.

FIG. 4 shows a plan view of the array 100 over the device Ob. An exemplary embodiment of the array 100 includes one set of 80 objectives 134a arranged in 8 rows "r," specifically "$r_1$"–"$r_8$," of 10 objectives per row as an example. However, the total number objectives and their distribution among rows and columns can be varied as desired.

Figure 5:
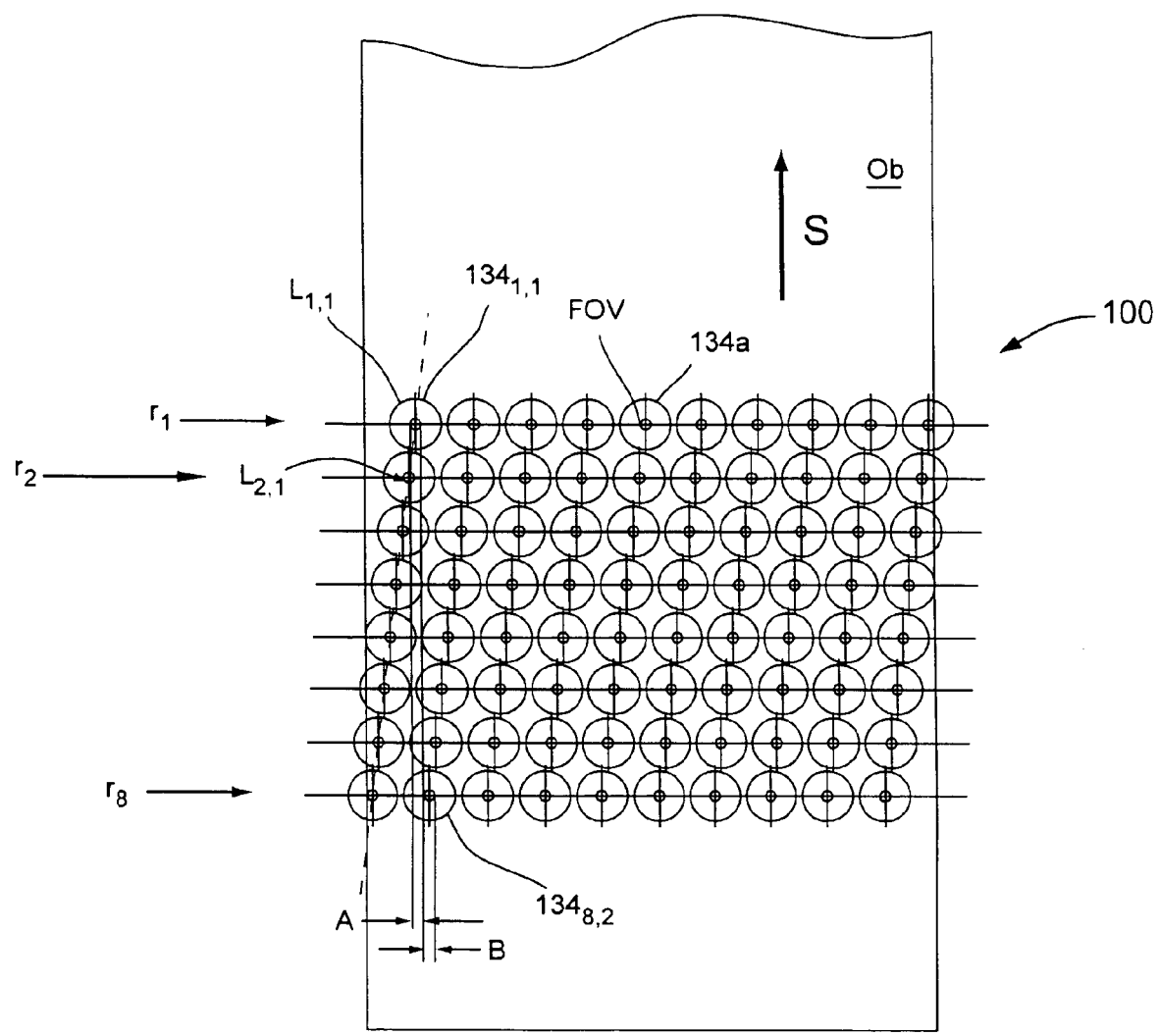
FIG. 5 is a plan view of the array of FIG. 1, showing objectives and their associated fields of view according to the present invention.

FIG. 5 shows the array of FIG. 4 in greater detail, illustrating the relatively large diameter of objectives 134a along with the much smaller "image fields of view" (IFOV) of the same objectives which contain the image projected by the system. That is, each objective 134a projects a relatively large pattern of light obtained from associated pixels 120 (not shown) onto the smaller IFOV to provide the demagnification that is typically desired in projection imaging. However, it should be understood that a projection imaging system may provide for no demagnification, or magnification, if desired.

At any instant in time, only the 80 small IFOV's in FIG. 5 are imaged. As the slide is scanned, however, each IFOV defines a columnar image area, where, for example, the columnar projected image area "A" corresponding to moving the device Ob in the scan direction "S" past the first objective $134_{1,1}$ of the first row "$r_1$" is adjacent the columnar projected image area "B" corresponding to the second objective $134_{8,2}$ of the last row "$r_8$." All 80 objectives are required to fill in the gaps between the IFOV's corresponding to the first row of objectives as the device is scanned to provide contiguous, seamless projected image strips or swaths.

A computer 126 (FIG. 1) produces electrical signals to control the object 128 to produce light varying in one or more spatial characteristics. Particularly, the computer controls the pixels 120 for this purpose. Image data for creating the pattern of light is synchronized with movement of the device on which the image is to be projected by appropriately ordering the image data in view of the physics of the system. For example, given the scan direction "S," data for triggering the first pixel $120_{1,1}$ of the first row "$r_1$" of the array 100, corresponding to the location $L_{1,1}$ of the device Ob (FIG. 5) is provided at a time "Δt" that precedes the time at which data is provided for triggering the first pixel $120_{2,1}$ of the second row of the array 100, corresponding to the adjacent location $L_{2,1}$ of the device. The time Δt is equal to the distance between the rows of the array divided by the scan velocity. In combination with calibrating the array 100 for overlap, the columnar image areas associated with the pixel $120_{1,1}$ and the pixel $120_{2,1}$ of the array 100 can be seamlessly concatenated simply by delaying the data for the pixel $120_{1,1}$ with respect to the data for the pixel $120_{2,1}$ by Δt. Similarly, the columnar image areas A and B may be seamlessly concatenated by delaying the data for the columnar image area "B," corresponding to the pixel $120_{8,2}$ by 8·Δt.

The device Ob may be exposed in two ways. The device may be continuously exposed either by step-and-repeat imaging (step-and-image) or by changing the image pattern at intervals of time or scanning translation. Alternatively and preferably, the device may be exposed by periodic stroboscopic illumination which minimizes blur in the exposed pattern. Referring back to FIG. 1, stroboscopic pulses from a stroboscope 60 can be tied to a position sensor 62 sensing the scan translation of the device to ensure that the device is exposed at specific locations as opposed to specific times.

Figure 6:
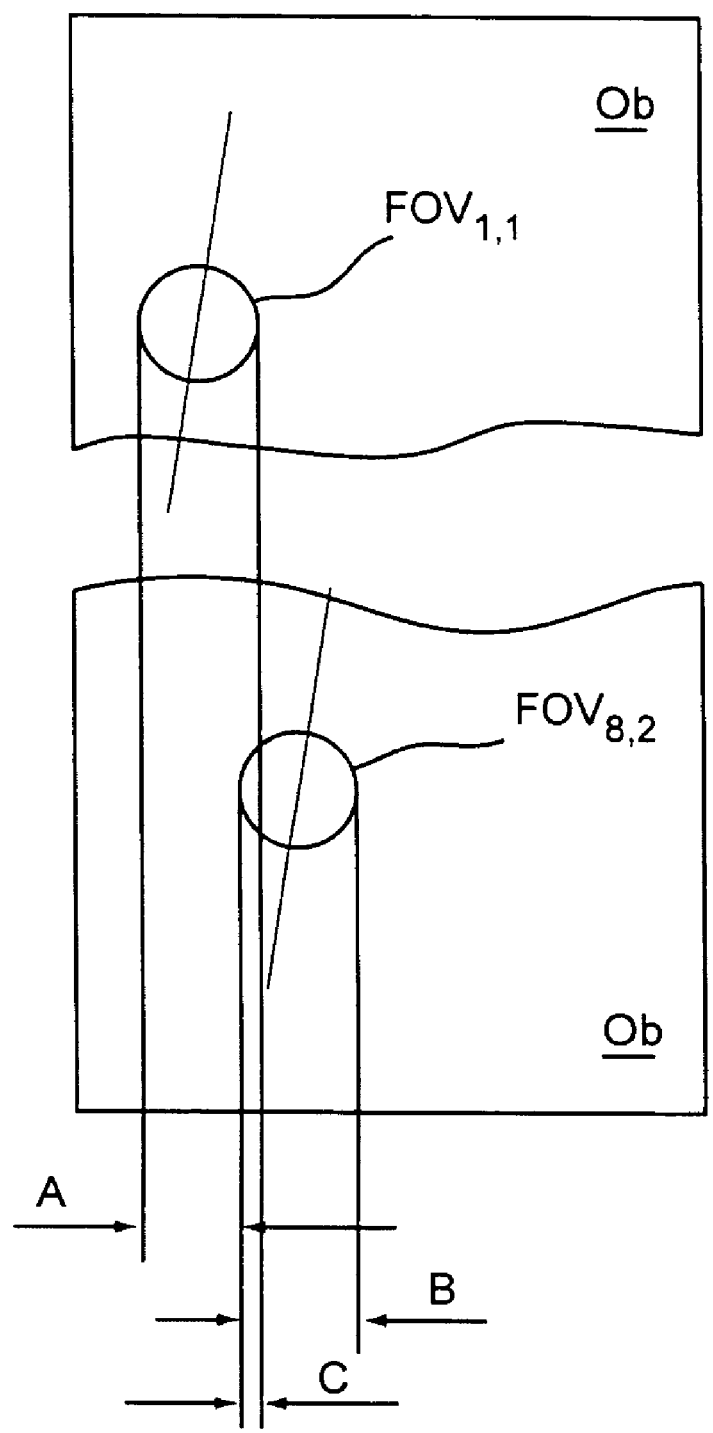
FIG. 6 is a plan view of the fields of view corresponding to two of the objectives of FIG. 5 shown in larger scale.

FIG. 6 shows the IFOV's of the two exemplary objectives $134_{1,1}$ and $134_{8,2}$ discussed above, specifically $IFOV_{1,1}$ and $IFOV_{8,2}$ in larger scale. In the above example it was assumed for simplicity of illustration that the lateral spacing between the objectives 134a was such that the IFOV's, and the columnar image areas A and B that result from scanning, did not overlap. However, some overlap indicated by the columnar image area "C" is desirable to accommodate manufacturing tolerances in the imaging system 100. In a step of lateral alignment, the array can be calibrated to adjust this lateral overlap appropriately for the system 100, to eliminate overlapping portions of the image areas.

Manufacturing tolerances also produce non-ideal spacing between the objectives in different rows, in the longitudinal or scan direction. In a step of longitudinal alignment, the system can be calibrated by delaying the light corresponding to one objective in one row with respect to the light corresponding to an adjacent objective in an adjacent row more or less than the delay that is indicated for the ideal case.

Figure 7:
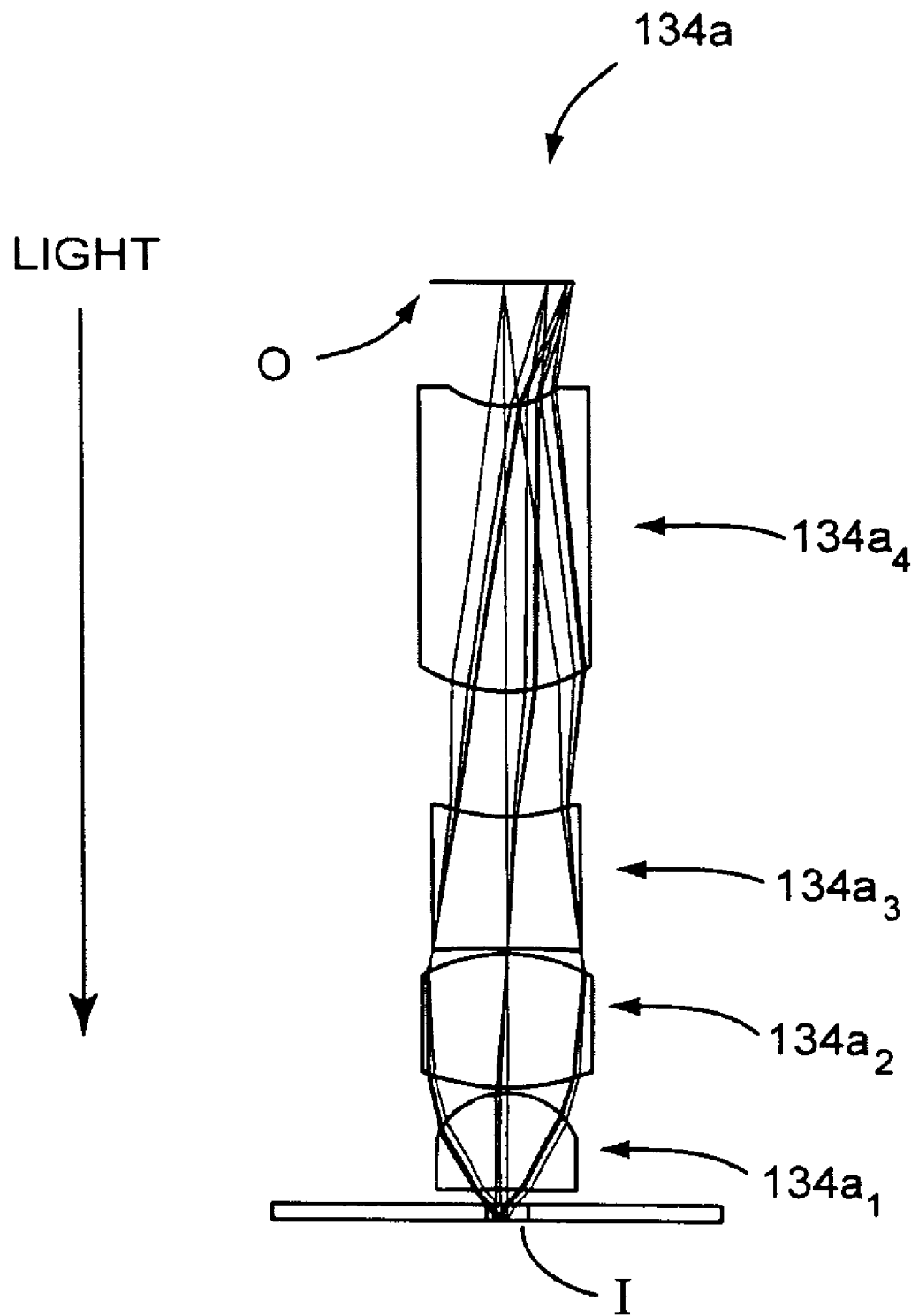
FIG. 7 is schematic, ray-trace diagram of an objective for a projection imaging system according to the present invention.

For multi-axis imaging systems such as the system 100, a high numerical aperture (NA) is desired for the objectives 134a to obtain high resolution. FIG. 7 shows a single-axis objective 134a of four optical elements $134a_1$–$134a_4$ designed for a 6× magnification from an object plane O to an image plane I using a wavelength of 665 nm and having a NA=0.75. The optical design of the objective is shown in Table 1:

TABLE 1

| Surf | Type | Radius | Thickness | Glass | Diameter | Conic |
|---|---|---|---|---|---|---|
| OBJECT | STANDARD | Infinity | 0.15 | BK7 | 0.22 | 0 |
| 1 | STANDARD | Infinity | 0.15 |  | 0.395 | 0 |
| 2 | STANDARD | −4.730 | 0.922 | COC | 0.682 | 0 |
| 3 | STANDARD | −0.588 | 0.050 |  | 1.317 | −0.5850 |
| 4 | STANDARD | 1.977 | 1.273 | COC | 1.573 | −2.414 |
| 5 | STANDARD | −1.387 | 0.050 |  | 1.593 | −2.085 |
| STOP | EVENASPH | −3.255 | 1.249 | POLYSTYR | 1.400 | 0 |
| 7 | STANDARD | 2.157 | 1.196 |  | 1.246 | 6.552 |
| 8 | EVENASPH | 1.191 | 2.687 | COC | 1.600 | 0 |
| 9 | STANDARD | 0.682 | 1.169 |  | 1.037 | −1.837 |
| IMAGE | STANDARD | Infinity | 1.350 |  |  | 0 |

| Asphere Coefficients on Surface 6: |
|---|
| r2:0<br>r4:0.30806182<br>r6:−0.20536501<br>r8:0.08932393 |

| Asphere Coefficients on Surface 8 |
|---|
| r2:0<br>r4:−0.14898888<br>r6:−0.021163623<br>r8:−0.00757607 |

The object 128 produces light that varies spatially in one or more selected characteristics of the light. Examples of such characteristics are intensity, color, polarization, and phase. Spatial variation is variation in the one or more characteristics with respect to different points in space. Light can vary spatially between one group 119 of pixels 120 corresponding to one objective 134a, and another group of pixels corresponding to another objective. More particularly and preferably, the light is controllable so that it is variable spatially within the group of pixels corresponding to any one objective. This is achieved in the system 100 by controlling the light produced by each pixel 120. This control provides for defining a desired pattern of light, and consequently defining a mask in a photolithography application.

Figure 8:
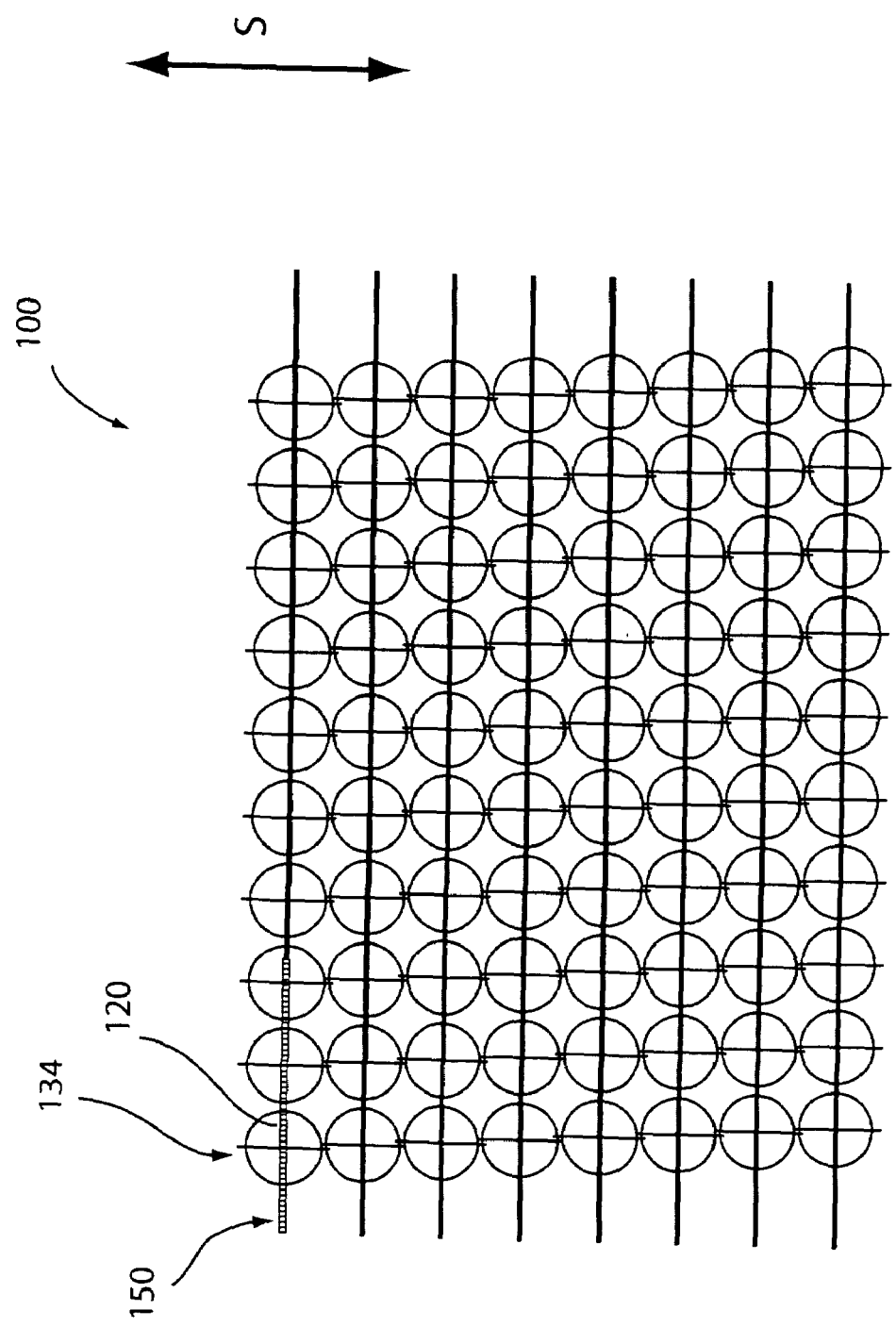
FIG. 8 is a plan view of the array of FIG. 1, showing groups of light producing elements distributed in a linear array along with corresponding objectives.

With reference to FIG. 8, the pixels 120 are preferably distributed in linear arrays 150 aligned in a direction perpendicular to a scan direction "S," as shown. It may be noted that the objectives 134a in the array as shown in FIG. 8 are staggered in the opposite direction as that shown in FIGS. 4–6, to emphasize that the direction is arbitrary.

Figure 9A:
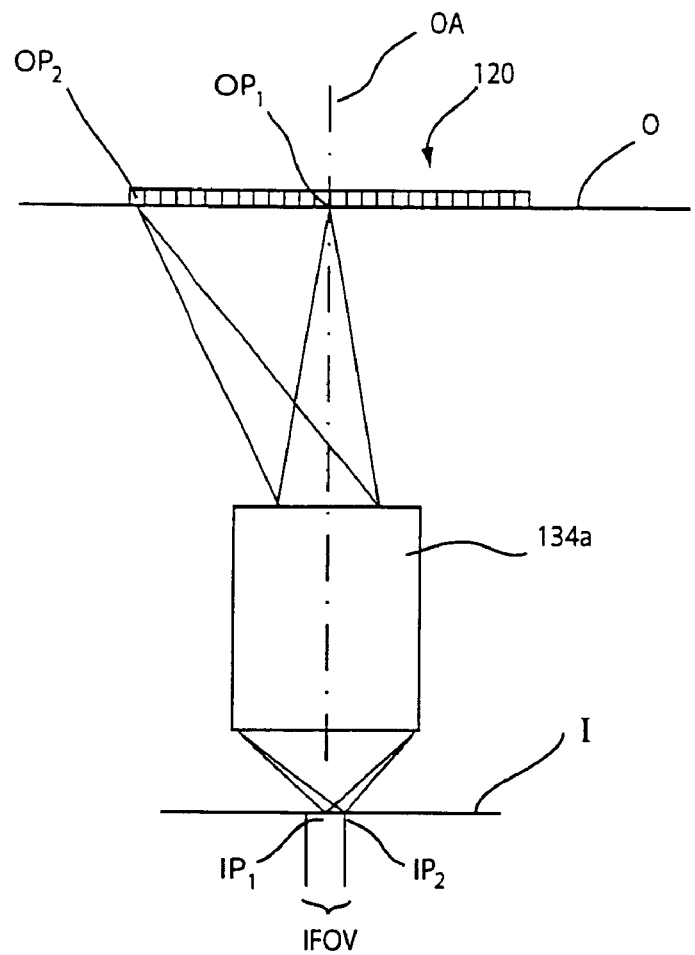
FIG. 9A is a side elevation of one of the objectives of the system of FIG. 1 and a corresponding 1-D array of light producing elements according to the present invention, showing an object plane and an image plane.
Figure 9B:
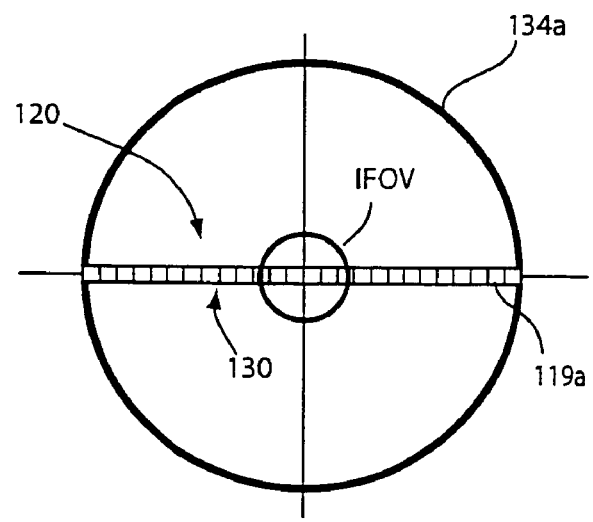
FIG. 9B is a plan view of the objectives and group of light producing elements of FIG. 9A.

FIGS. 9A and 9B show the array 150 in more detail. Each pixel 120 contains a light producing ("active") area 132. The active areas of the pixels 120 are disposed in the object plane O for imaging onto the image plane I. For example, the objective 134a images an object point $OP_1$ on the optical axis OA of the object plane to an image point $IP_1$ on the optical axis of the image plane I, and images an off-axis object point $OP_2$ on the object plane (on the periphery of the OFOV of the objective) to an image point $IP_2$ on the image plane.

Figure 10A:
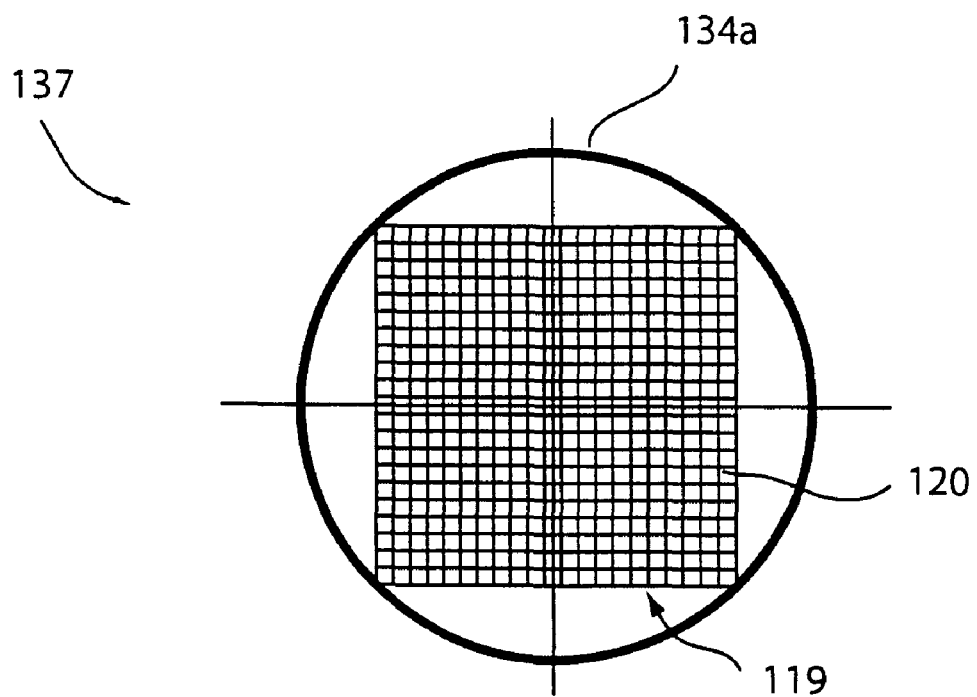
FIG. 10A is a plan view of one of the objectives of the system of FIG. 1 and a corresponding 2-D array of light producing elements according to the present invention.

FIG. 10A shows an alternative, two-dimensional, configuration 137 for the pixels 120, defining a rectangular array of the pixels. The configuration 136 produces a two-dimensional pattern of light at a given instant in time.

Figure 10B:
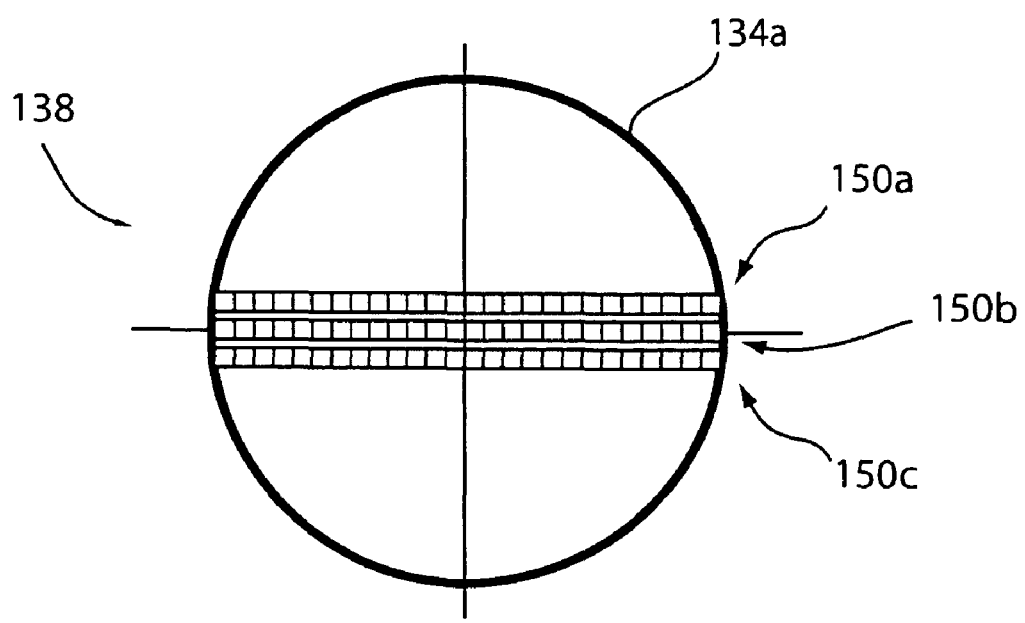
FIG. 10B is a plan view of one of the objectives of the system of FIG. 1 and corresponding multiple 1-D arrays of light producing elements according to the present invention.

FIG. 10B shows another alternative, two-dimensional, configuration 138 for the pixels 120, where multiple linear arrays 150 are employed so as to combine their outputs to produce a composite pattern of light corresponding to a single scanning line. For example, the linear arrays 150 may be covered by different spectral filters, so that the linear array 150a may be covered with a filter that transmits red (R) light, the linear array 150b may be covered with a filter that transmits green (G) light, and the linear array 150c may be covered with a filter that transmits blue (B) light. Scanning with the configuration 138 forms respective patterns of light for the same scan line in different colors, and the different color patterns together produce a composite color pattern of light for the scan line ("RGB scan").

Another use of the linear arrays 150 is to introduce redundancy into the formation of a pattern of light. For example, in the event that a pixel in one of the linear arrays 150 fails to operate within acceptable specifications, then the effect of that pixel may be created by a corresponding pixel in another array. Given the configuration shown in FIG. 10B, up to two pixels at the same position within each linear array could fail and the desired pattern of light could still be completed.

Linear array portions of a two-dimensional array configuration for the pixels 120 may also be provided with different pixel-to-pixel spacings. For example, the pixel-to-pixel spacing associated with the array 150a of the configuration 138 may be adapted for the transverse magnification associated with the center wavelength of the particular spectral filter used to cover the array 150a.

A linear array of the pixels 120 (e.g., FIG. 8), or a two-dimensional array in which linear arrays are employed to combine their outputs to produce an image corresponding to a single scanning line ("1-D imaging array"), is particularly advantageous for continuous scanning. A two-dimensional configuration used for two-dimensional imaging ("2-D imaging array") is particularly advantageous for use with step-and-image scanning. A 2-D light producing array may also incorporate any number of 1-D light producing array elements.

Linear array portions of a two-dimensional array configuration for the pixels may also be used to increase the signal-to-noise ratio (SNR) of a pattern of light in a technique known as time-delay-and-integration (TDI). As the device is moved for scanning the device line-by-line, image data defining the pattern of light for each line is repeatedly projected onto the line as it moves, to provide multiple exposures. The multiple exposures can allow a higher exposure dose than is possible with a single exposure, can compensate for defective pixels in the array, and can permit grayscale patterning with binary image data.

The object 128 shown in FIGS. 9A and 9B emits spatially variable light. Such an object is termed a "light source array" (LSA). Examples of pixels 120 for the LSA are organic light emitting diodes (OLEDs), or vertical-cavity surface-emitting lasers (VCSELs).

Figure 11:
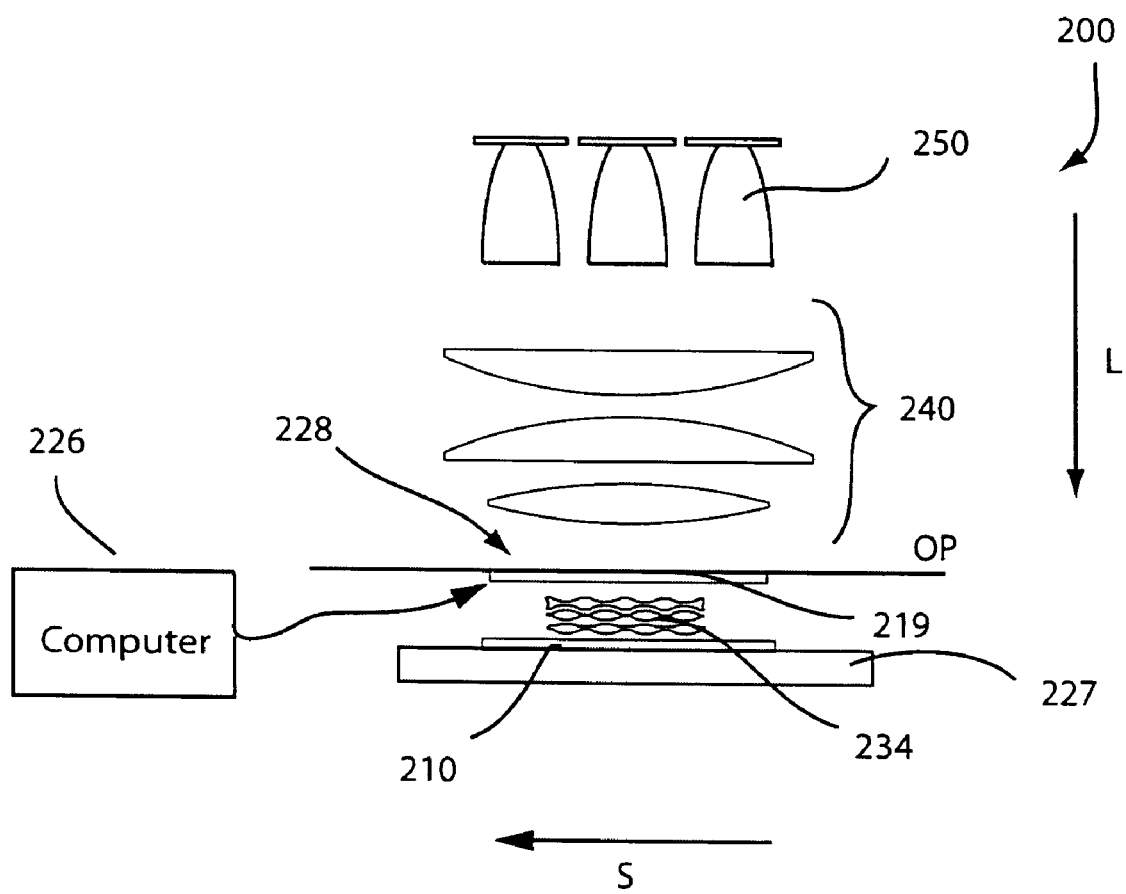
FIG. 11 is a side elevation of a second exemplary embodiment of a projection imaging system according to the present invention employing a light source array.

Turning to FIG. 11, a second exemplary embodiment 200 of a projection imaging system according to the present invention is shown. Associated with an array of objectives 234 is a group 219 of pixels that are part of a "patial light modulator" (SLM) 228 that is imaged onto a device 210. The SLM 228 is illuminated by light sources 250 through a condenser lens system 240. In this case, a single-axis illumination system is used to simultaneously provide light to the multiple reproduction systems represented by the multiple objectives in the array.

As mentioned above, an LSA emits spatially variable light. The SLM is an alternative form of object which attenuates or otherwise modulates spatially light that is, at first, not spatially variable. The SLM may modulate light transmitted through the SLM ("transmissive SLM") or light reflected from the SLM ("reflective SLM"). The flat screen used in many televisions and computers is a common example of a transmission SLM. Such transmissive SLM's employ a liquid crystal sandwiched between two plates, one of which is patterned with pixellated electrodes, and are commercially available from many sources, such as Medowlark Optics, Inc. An example of a reflective SLM employs an array of tilting mirrors that is commercially available from Texas Instruments as the Digital Micromirror Device™.

The embodiment 200 is shown with a transmissive SLM having an array of pixels (not shown). As for the aforedescribed pixels 220, each pixel is controlled by electrical signals generated by a computer (226).

The object 228 can be adapted to provide a "critical illumination" modality where the pattern of light is projected onto the object plane "OP" for the object 228, or a "Kohler illumination" modality where the pattern of light is projected into the system entrance pupil.

A computer 226 controls the SLM with electrical control signals to cause the SLM to vary the radiance of the light transmitted therethrough according to a computer program that defines a semiconductor mask. For typical integrated circuit manufacture, the SLM simply provides for turning selected pixels "on" (so that the SLM transmits light received at the location of the pixel), or "off" (so that the SLM is opaque to light received at the location of the pixel); however, the SLM may provide for levels of transparency if desired. The computer 226 also controls a motorized translating stage 227 for moving the wafer in the scan direction "S" relative to the objective 234a, to provide scan translation.

Figure 12A:
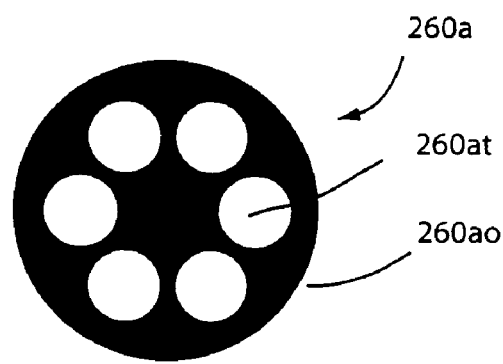
FIG. 12 is an aperture mask for use with the system of FIG. 11.
Figure 12B:
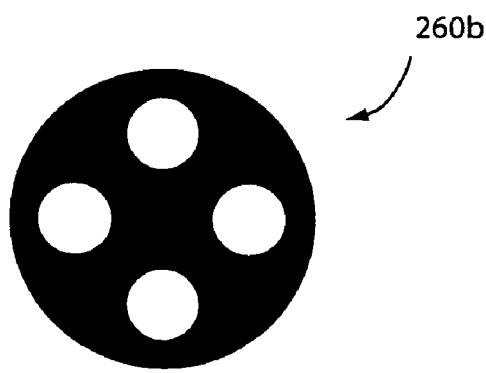
Figure 12C:
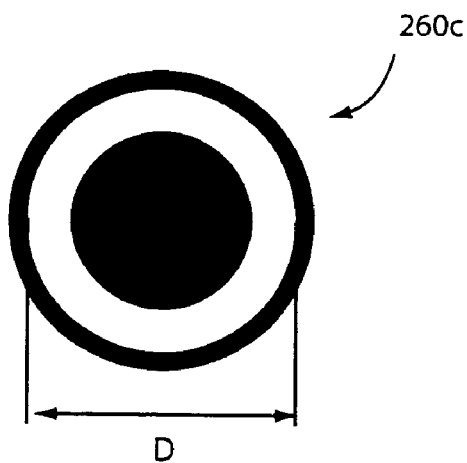

FIG. 12A shows an aperture mask 260a that may be used in the object 228 to produce partial coherence from light emitting elements 250. The aperture mask 260a contains one or more opaque portions 260ao and one or more transparent portions 260at. FIG. 12B is a "quadrupole" version 260b of the aperture mask 260a, while FIG. 12C is a transparent annulus aperture mask 260c where the outer diameter D is less than the diameter of the aperture stop.

The aperture mask is inserted before the SLM and within the condenser lens system 250 and effectively alters the angular distribution of light projected onto the SLM. The same effect can be achieved by disposing the aperture mask in the aperture plane of each objective 134a.

Where the object 228 employs a LSA with controllable light emitting elements in place of the fixed light emitting elements 240, the condenser system 250 and the SLM, the aperture mask 260 may still be used, or a non-contiguous LSA can be arranged to produce a fixed light pattern that emulates that of the mask 260.

Transmissive SLM's have some drawbacks; they may not be transparent at the wavelengths that are desired, they generally require higher power to overcome transmission losses, chromatic aberrations can be introduced into the light beam, and the latency of the response of the SLM may be objectionable, especially in SLM's employing liquid crystals.

Most of these drawbacks can be avoided by using reflective SLM's; however, the limited working distance between the object and the device on which light produced by the object is projected creates a problem for the use of reflective SLM's in multi-axis imaging systems such as the system 100. Two embodiments employing reflective SLM's are next described that solve this problem.

Figure 13:
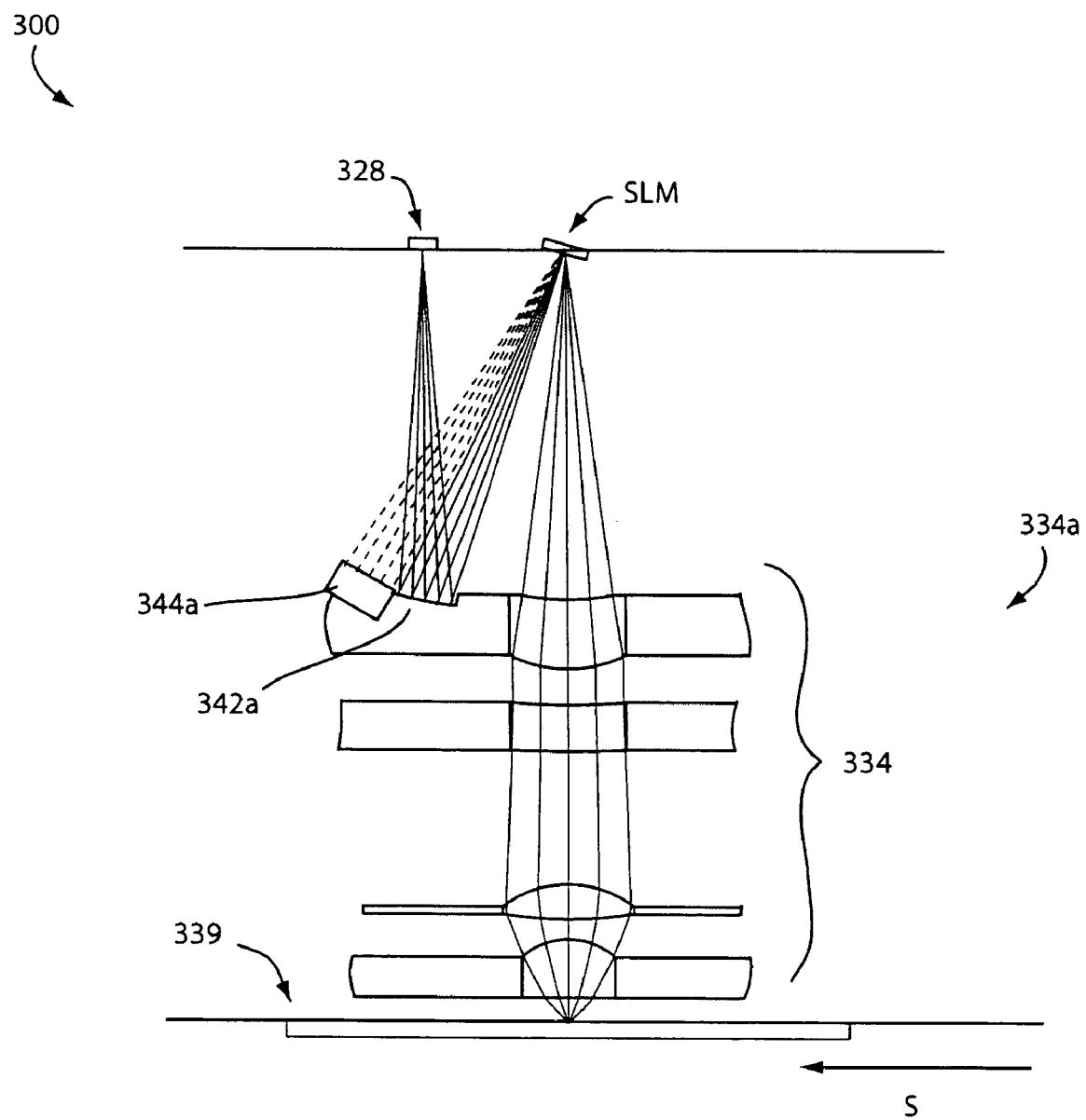
FIG. 13 is a first exemplary embodiment of a projection imaging system according to the present invention employing a reflective spatial light modulator.

FIG. 13 shows a first embodiment 300 of a multi-axis imaging system employing a reflective SLM. The system 300 includes an objective 334a of optical elements 334. An object 328 produces light that is relayed by a relaying system 342a to the SLM. The relaying system in this embodiment comprises reflective optics. The reflective SLM directs the relayed light through the objective 334a and onto a device 339 translating in scan direction "S." The relaying system is shown in FIG. 13 as consisting of a single optical surface. Other configurations are possible that include more than one optical surface, a faceted optical surface, or a combination thereof.

The reflective SLM includes a means for sinking light 344a that it is not desired to have projected through the system. For example, in the aforementioned Micromirror Device, the mirrors are tiltable to reflect light out of the system, corresponding to turning a corresponding pixel "off." Means is provided to ensure that the light reflected out of the system does not reflect back into the system, such as by the use of baffles or a light-absorbing material.

Figure 14:
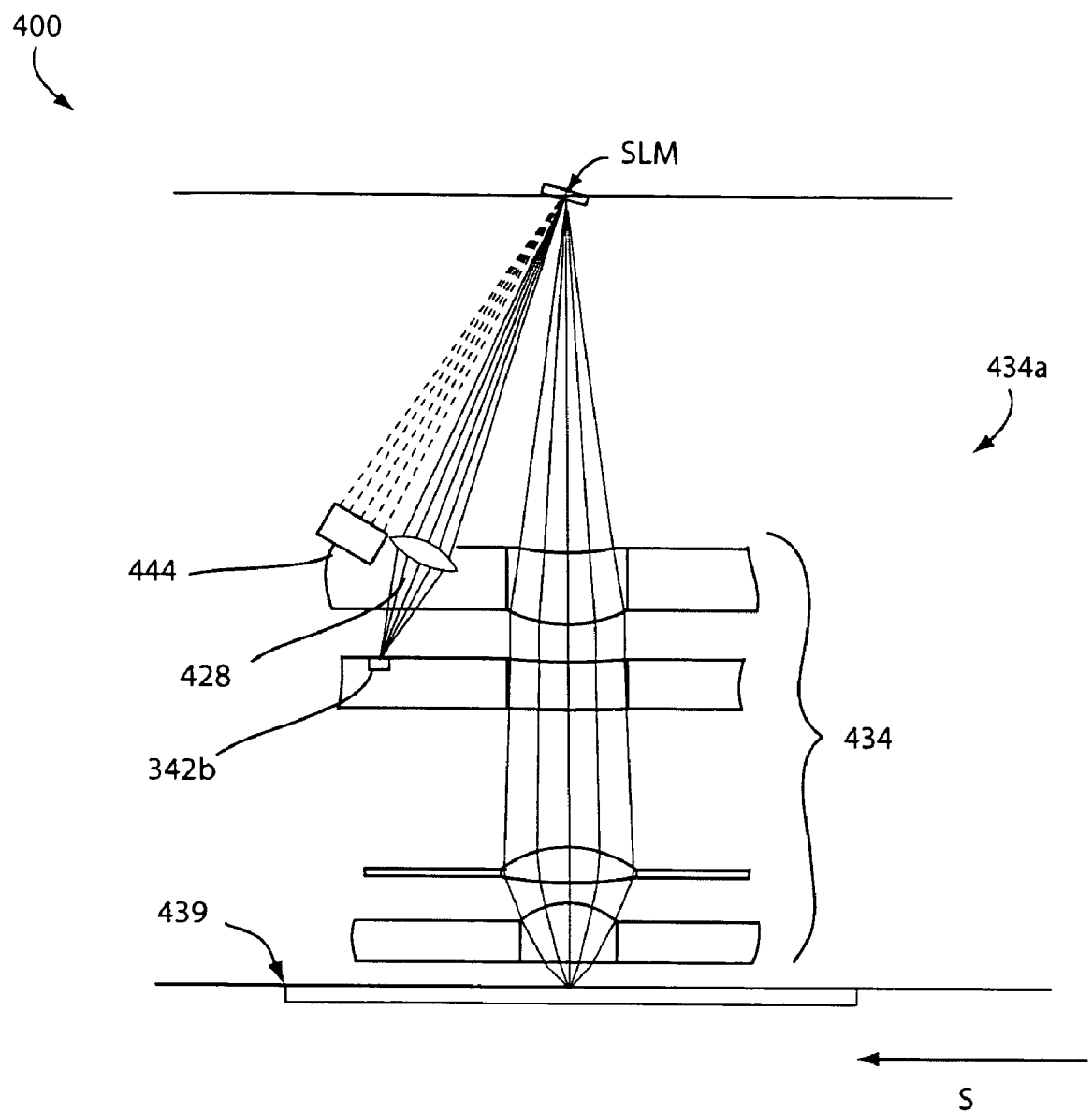
FIG. 14 is a second exemplary embodiment of a projection imaging system according to the present invention employing a reflective spatial light modulator.

FIG. 14 shows a second embodiment 400 of a multi-axis imaging system employing a reflective SLM. The system 400 includes an objective 434a of optical elements 434. An object 438 produces light that is relayed by a relaying system 342b to the SLM. The relaying system in this embodiment comprises refractive optics. The reflective SLM directs the relayed light through the objective 434a and onto a device 439. In either of the embodiments 300 and 400, the relaying system may comprise a combination of reflective and refractive optics.

The array configuration of the imaging systems described above provides an outstanding advantage when used as an optical imager in integrated circuit manufacturing as compared to the prior art. Particularly, the array configuration provides that no trade-off is required to obtain both high resolution and a large overall field of view. The alternative single-axis lens system requires a large, heavy, and expensive objective to provide the same optical properties, and there are some applications in which the cost of such a single-axis lens system is prohibitive.

Figure 9C:
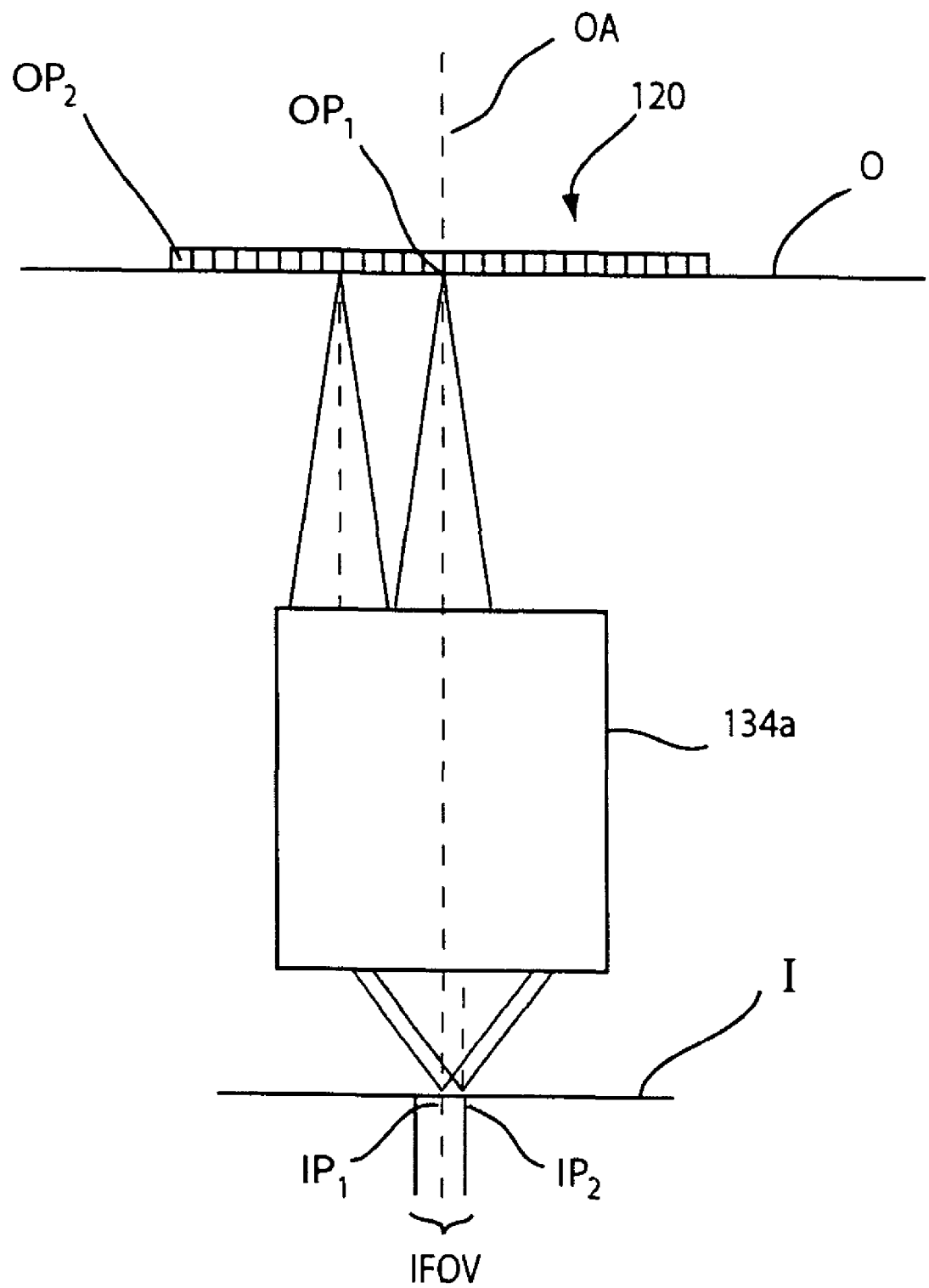
FIG. 9C is a double-telecentric embodiment of the objective of FIG. 9A.

The preferred optical design of the objectives 134a for any of the imaging systems described herein is known in the art as "double-telecentric." In a double-telecentric design, the objective is telecentric in both object and image spaces, i.e., the entrance and exit pupils are disposed an infinite distance away from the respective object and image planes. The double-telecentric design provides the advantage that if either or both of the object and image planes are out of focus, the magnification, and therefore the distance between geometrically defined features, will not change. This is especially advantageous when the systems are used to produce a mask for use in the photolithographic manufacture of integrated circuits. FIG. 9C shows a double-telecentric embodiment of the objective shown in FIG. 9A.

In an arrayed projection system according to the present invention, the characteristics of the object, as well as the characteristics of the objectives, will generally vary across the array as a result of manufacturing tolerances. This can cause an objectionable variation in the dose used, e.g., to expose photoresist in photolithographic manufacturing processes. A calibration step may be provided to correct for differences in the characteristics of the light produced and projected onto a device through different objectives. Such characteristics typically include radiance (energy/area-solid angle), intensity (energy/solid angle), irradiance (energy/area), and color. For example, the pixels of a LSA will generally vary in irradiance. Accordingly, the current used to generate light in each pixel can be varied to vary the output of each pixel. Similarly, the pixels of an SLM will typically vary in opacity. Accordingly, the current provided to the pixels of the SLM may be varied to vary the opacity of each pixel.

The illumination system can be designed using well-known software that characterized the optical properties of the system from this vantage point as opposed to the vantage point of the objectives. Light-level equalizing filters may also be provided for the illumination system as a whole, or for the individual objectives. Appropriate filters may also be employed to correct for variations in any of the aforementioned light characteristics.

Figure 15:
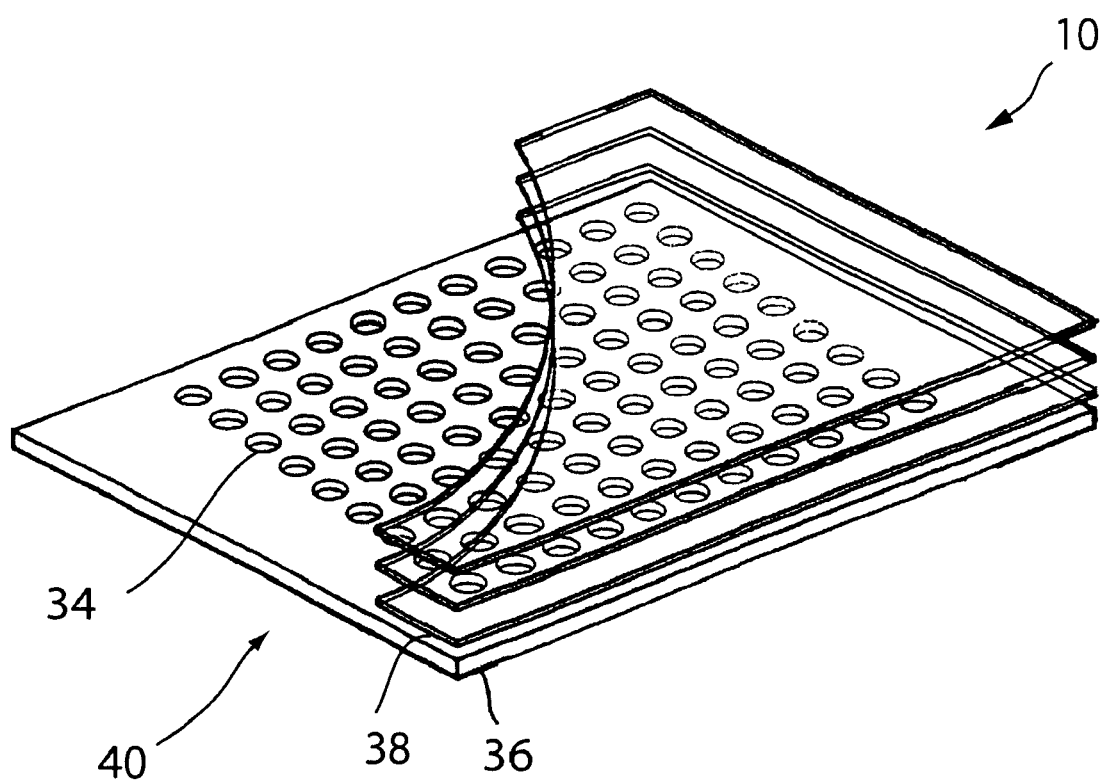
FIG. 15 is a pictorial view of a preferred construction for imaging systems according to the present invention.

FIG. 15 illustrates a preferred construction of the objectives for the imaging systems. One or more refractive plates or substrates 40, e.g., 36 and 38, having optical components 34 are stacked one on top of another. The plates 40 may be provided with an array of sockets for installing optical components individually (see plate 36 ), but are preferably formed along with the optical components using a means of integrated manufacture. For example, a refractive plate may be provided with an array of optical elements by injection molding in a single manufacturing operation. Such optical elements include, but are not limited to, lenslets, aspherical lenses, diffractive components, cubic phase plates, and apertures. Refractive plates may also be integrally manufactured using photolithographic techniques, embossing, or laser-printing.

It is to be recognized that, while particular multi-axis projection imaging systems have been shown and described as preferred, other configurations and methods may be employed without departing from the principles of the invention.

The terms and expressions that have been employed in the foregoing specification are used therein as terms of description and not of limitation, and there is no intention, in the use of such terms and expressions, to exclude equivalents of the features shown and described or portions thereof, it being recognized that the scope of the invention is defined and limited only by the claims that follow:

The invention claimed is:
1. A multi-axis imaging system, comprising:
   a plurality of objectives defining respective object fields of view and corresponding image fields of view, said objectives being configured in a two-dimensional array of rows and columns of individual objectives;

an object for controllably illuminating said object fields of view with light that varies spatially in one or more selected characteristics, for creating respective images within said image fields of view; and a scanning mechanism for varying a position of said array in relation to a device along a scan direction;

wherein each of said rows in the array is transversely offset from an adjacent row with respect to said scan direction, such that said image fields of view define respective, substantially columnar, image areas during a scan.

2. The apparatus of claim 1, wherein said object produces as an object a predetermined radiance pattern to be imaged onto an image surface within said image fields of view.

3. The apparatus of claim 1, wherein said object is adapted to be controlled by electrical signals.

4. The apparatus of claim 3, wherein said object includes computer-controlled light emitting pixels, each set of pixels corresponding to a different image field of view.

5. The apparatus of claim 3, wherein said object includes computer-controlled light modulating pixels, each set of pixels corresponding to a different image field of view.

6. The apparatus of claim 1, wherein said one or more selected characteristics includes the radiance of said light.

7. The apparatus of claim 1, wherein said objectives are double-telecentric.

8. The apparatus of claim 1, further comprising a set of apertures optically disposed with respect to said objectives to produce partial coherence in the light associated therewith.

9. The apparatus of claim 1, wherein said object is adapted to produce light as an object that varies spatially in said one or more characteristics within different object fields of view.

10. The apparatus of claim 9, wherein the optical axes of said objectives are parallel.

11. The apparatus of claim 10, wherein said image fields of view are smaller than the corresponding object fields of view, for demagnifying said object.

12. The apparatus of claim 1, further comprising a position sensor for sensing said position of the array during the scan, and a stroboscopic triggering mechanism for stroboscopically triggering said light in relation to said position.

13. A method for imaging, comprising:

providing a plurality of objectives defining respective object fields of view and corresponding image fields of view, said objectives being configured in a two-dimensional array of rows and columns of individual objectives;

controllably illuminating said object fields of view with light that varies spatially in one or more selected characteristics, for creating respective images within said image fields of view; and varying a position of said array in relation to a device along a scan direction;

wherein each of said rows in the array is transversely offset from an adjacent row with respect to said scan direction, such that said image fields of view define respective, substantially columnar, image areas during a scan.

14. The method of claim 13, wherein said step of illuminating produces as an object a predetermined radiance pattern to be imaged onto an image surface within said image fields of view.

15. The method of claim 13, further comprising controlling said illumination with electrical signals.

16. The method of claim 15, further comprising providing light emitting pixels for controlling said illumination, each set of pixels corresponding to a different image field of view.

17. The method of claim 15, further comprising providing light modulating pixels for controlling said illumination, each set of pixels corresponding to a different image field of view.

18. The method of claim 17, wherein said one or more selected characteristics includes the radiance of said light.

19. The method of claim 13, wherein said objectives are double-telecentric.

20. The method of claim 13, further comprising providing a set of apertures optically disposed with respect to said objectives to produce partial coherence in the light associated therewith.

21. The method of claim 13, wherein said step of illuminating produces light as an object that varies spatially in said one or more characteristics within different object fields of view.

22. The method of claim 21, wherein the optical axes of said objectives are parallel.

23. The method of claim 22, wherein said image fields of view are smaller than the corresponding object fields of view, for demagnifying said object.

24. The method of claim 13, further comprising optically disposing photosensitive material at said image fields of view, to expose said photosensitive material according to said object fields of view.

25. The method of claim 24, further comprising applying said photosensitive material to a device, for defining features on said device with said images.

26. The method of claim 25, wherein said photosensitive material is photoresist.

27. The method of claim 26, wherein said image fields of view are smaller than the corresponding object fields of view, for demagnifying said object fields of view to define small features on said device.

28. The method of claim 27, wherein said device is a semiconductor wafer.

29. The method of claim 28, wherein said illumination is triggered stroboscopically in relation to said position.

30. The method of claim 28, wherein said light is continuously provided.

31. The method of claim 14, wherein said image surface is part of a device, and said light is triggered stroboscopically in relation to said position.

32. The method of claim 14, wherein said light is continuously provided.

33. The method of claim 14, wherein said image surface is part of a device, the method further comprising translating said device so as to vary the position thereof, wherein said light is triggered stroboscopically in relation to said position.

* * * * *